(12) United States Patent
Zhang et al.

(10) Patent No.: US 8,472,997 B2
(45) Date of Patent: Jun. 25, 2013

(54) POWER AMPLIFICATION METHOD AND APPARATUS

(75) Inventors: Shunqing Zhang, Shanghai (CN); Shugong Xu, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 13/571,690

(22) Filed: Aug. 10, 2012

(65) Prior Publication Data

US 2012/0315947 A1 Dec. 13, 2012

Related U.S. Application Data

(63) Continuation of application No. PCT/CN2011/083567, filed on Dec. 6, 2011.

(30) Foreign Application Priority Data

Dec. 6, 2010 (CN) .......................... 2010 1 0574543

(51) Int. Cl.
*H04B 7/00* (2006.01)
(52) U.S. Cl.
USPC ............ 455/522; 455/69; 455/70; 455/127.1; 455/343.1; 455/450
(58) Field of Classification Search
USPC ............... 455/522, 69–70, 450–453, 561, 127.1–127.5, 293, 343.1–343.5
See application file for complete search history.

(56) References Cited

U.S. PATENT DOCUMENTS

| | | |
|---|---|---|
| 2002/0094835 A1 | 7/2002 | Hayashi et al. |
| 2002/0146993 A1 | 10/2002 | Persico et al. |
| 2005/0156669 A1 | 7/2005 | Ando |
| 2008/0095264 A1 | 4/2008 | Deng et al. |
| 2009/0016275 A1 | 1/2009 | Liu et al. |
| 2010/0023972 A1* | 1/2010 | Summers et al. ............... 725/54 |
| 2010/0061344 A1 | 3/2010 | Göransson et al. |
| 2010/0080163 A1* | 4/2010 | Krishnamoorthi et al. ... 370/312 |
| 2011/0189997 A1* | 8/2011 | Tiwari et al. .................. 455/443 |

FOREIGN PATENT DOCUMENTS

| | | |
|---|---|---|
| CN | 1515069 | 7/2004 |
| CN | 1860803 | 11/2006 |
| CN | 1870614 | 11/2006 |
| EP | 1432183 A2 | 6/2004 |
| EP | 1569330 A1 | 8/2005 |
| EP | 2251975 A1 | 11/2010 |
| WO | 0152425 A2 | 7/2001 |
| WO | WO 2008/055179 A3 | 5/2008 |

OTHER PUBLICATIONS

Written Opinion issued in corresponding PCT application No. PCT/CN2011/083567, dated Mar. 15, 2012, total 11 pages.
PCT International Search Report mailed Mar. 15, 2012, issued in related International Application No. PCT/CN2011/083567, Huawei Technologies Co., Ltd. (2 pages).
Choi et al., "Resource Management for Advanced Transmission Antenna Satellites", *IEEE Transactions on Wireless Communications*, vol. 8, No. 3, Mar. 2009, pp. 1308-1321.
Search report issued in corresponding European patent application No. 11847594.6, dated Oct. 5, 2012, total 6 pages.

* cited by examiner (Continued)

*Primary Examiner* — Fayyaz Alam

(57) ABSTRACT

A method for implementing power amplification processing includes: obtaining power amplifier feature information and service requirement information of a power amplifier, where the service requirement information includes requirement information of a real-time service and requirement information of a non-real-time service; determining a regulation parameter and a scheduling parameter of the power amplifier according to the service requirement information and the power amplifier feature information; and performing, by the power amplifier, transmit power regulation according to the regulation parameter to obtain amplified transmit power.

20 Claims, 3 Drawing Sheets

POWER AMPLIFICATION METHOD AND APPARATUS

This application is a continuation of International Application No. PCT/CN2011/083567, filed on Dec. 6, 2011, which claims priority to Chinese Patent Application No. 201010574543.6, filed on Dec. 6, 2010, both of which are hereby incorporated by reference in their entireties.

FIELD OF THE INVENTION

Embodiments of the present invention relate to communications technologies, and in particular, to a communication base station and a power amplification processing method of the communication base station.

BACKGROUND OF THE INVENTION

A power amplifier, generally referred to as PA, is an important component part of a network device, for example, a base station, in a radio system. The network device needs to use a power amplifier to perform power amplification processing on a signal.

The power amplifier plays a critical role in transforming an analog small signal into a radio frequency signal for transmission. The power amplifier has low efficiency in transforming an analog signal and is not reasonably used. Therefore, energy consumption of the whole base station is affected to a great extent. To construct a more environment-friendly and energy-saving radio network in future, how to improve transform efficiency of the power amplifier and how to reasonably utilize the power amplifier become important technical breakthroughs of future energy-saving and emission-reduction.

In an actual application, radio service traffic imbalance causes the power amplifier to work for a long time in a region that has a low load and low power amplifier transform efficiency, so that the power amplifier can hardly work in a region that has a heavy load and high power transform efficiency. In another aspect, recognition of a power amplifier feature is insufficient during conventional radio resource management in a low load region, and the power amplifier feature cannot be managed and utilized well, thereby causing low utilization of the power amplifier.

SUMMARY OF THE INVENTION

Embodiments of the present invention provide a method and apparatus for implementing power amplification processing, so that efficiency of a power amplifier is improved through joint management of a power amplifier feature and a radio resource.

An embodiment of the present invention provides a method of operating a power amplifier, where the method includes:

obtaining power amplifier feature information and service requirement information, where the service requirement information includes requirement information of a real-time service and requirement information of a non-real-time service;

selecting a power amplifier regulation parameter and a scheduling parameter according to the service requirement information and the power amplifier feature information; and setting power amplifier transmit power in accordance with the selected regulation parameter to obtain amplified transmit power, where the amplified transmit power satisfies a requirement of traffic of the real-time service, and scheduling, by the power amplifier, a service of the non-real-time service according to the scheduling parameter, and allocating power amplifier output power requirements of the non-real-time service to at least two different time periods.

A further embodiment of the present invention provides a base station including a power amplifier and a power scheduling apparatus. The power scheduling apparatus is configured to obtain power amplifier feature information and service requirement information and to select a power amplifier regulation parameter and a scheduling parameter according to the service requirement information and the power amplifier feature information, where the service requirement information includes requirement information of a real-time service and requirement information of a non-real-time service; and the power amplifier performs transmit power regulation according to the regulation parameter to obtain amplified transmit power, where the amplified transmit power satisfies a requirement of traffic of the real-time service; and the power amplifier schedules a service in the non-real-time service according to the scheduling parameter and allocates output power requirements of the non-real-time service to different time periods.

In the embodiments of the present invention, the power amplifier feature information is obtained, and services are categorized into a real-time service and a non-real-time service. During scheduling, the non-real-time service is properly scheduled according to an analysis of the power amplifier feature and a situation of the real-time service. In this way, most of services are in a region where the power amplifier works with higher efficiency, thereby improving a utilization rate of the power amplifier.

DETAILED DESCRIPTION OF THE EMBODIMENTS

In a typical scenario of a current network, distribution of service traffic is imbalanced, and service traffic of more than half of base stations is lower than 5%. More than 50% of service traffic is concentrated on 10% of base stations, and loads of most base stations are not high.

In the embodiments of the present invention, with a radio resource management method based on a power amplifier feature, effective radio resource management is implemented by using the power amplifier feature. In addition, with respect to different types of services (for example a real-time service and a non-real-time service), scheduling and parameter configuration of a power amplifier is properly modified by using a radio resource management technology, so that an effect of energy efficiency improvement is achieved.

Figure 1:
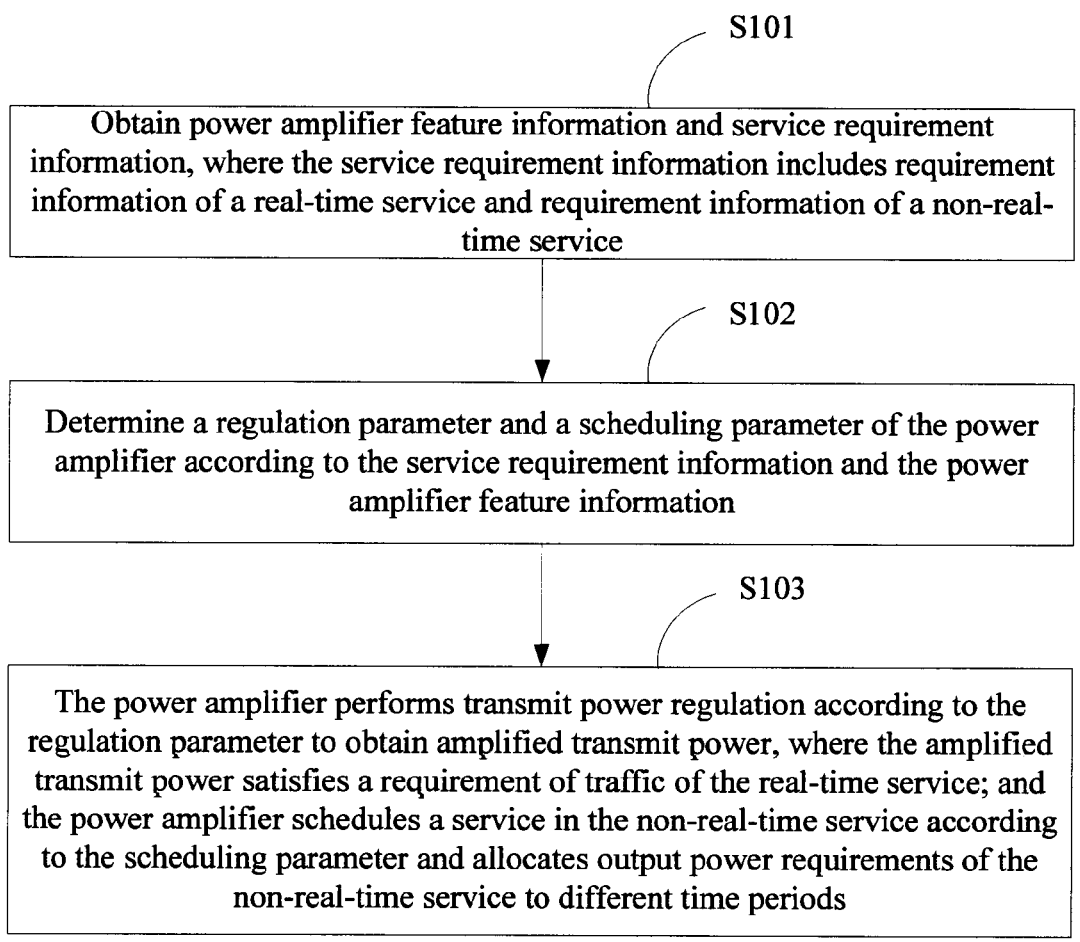
FIG. 1 is a flowchart of a method according to an embodiment of the present invention.

FIG. 1 is a flowchart of a method for scheduling signal transmit power according to an embodiment of the present invention. The method for scheduling signal transmit power includes:

S101: Obtain power amplifier feature information and service requirement information, where the service requirement information includes requirement information of a real-time service and requirement information of a non-real-time service.

In actual application, whether an obtained service is a real-time service may be determined through deep packet inspection (DPI). Alternatively, whether a service is a real-time service is specified by a user or a system.

S102: Determine a regulation parameter and a scheduling parameter of a power amplifier according to the service requirement information and the power amplifier feature information.

S103: The power amplifier performs transmit power regulation according to the regulation parameter to obtain amplified transmit power, where the amplified transmit power satisfies a requirement of traffic of the real-time service; and the power amplifier schedules a service in the non-real-time service according to the scheduling parameter and allocates output power requirements of the non-real-time service to different time periods.

With the method in this embodiment of the present invention, the power amplifier feature information is obtained, and services are categorized into a real-time service and a non-real-time service. During scheduling, the non-real-time service is properly scheduled according to an analysis of the power amplifier feature and a situation of the real-time service. In this way, most of services are in a region where the power amplifier works with higher efficiency, thereby improving a utilization rate of the power amplifier.

In this embodiment of the present invention, the radio resource management method based on the power amplifier feature may be performed by a power scheduling module or apparatus of a power amplifier of a base station. In a GSM/UMTS system, the power scheduling module or apparatus is deployed on a base station controller, while in an LTE system, the power scheduling module or apparatus is deployed on an eNB. In this method, in addition to addition of management that is based on the power amplifier feature, a procedure also needs to be designed for a radio resource management manner that is based on the power amplifier feature. This method mainly includes the following steps:

S201: Obtain power amplifier feature information of a power amplifier.

Further, in this embodiment, an environment may also be detected to obtain instant information of power amplifier monitoring.

Figure 2:
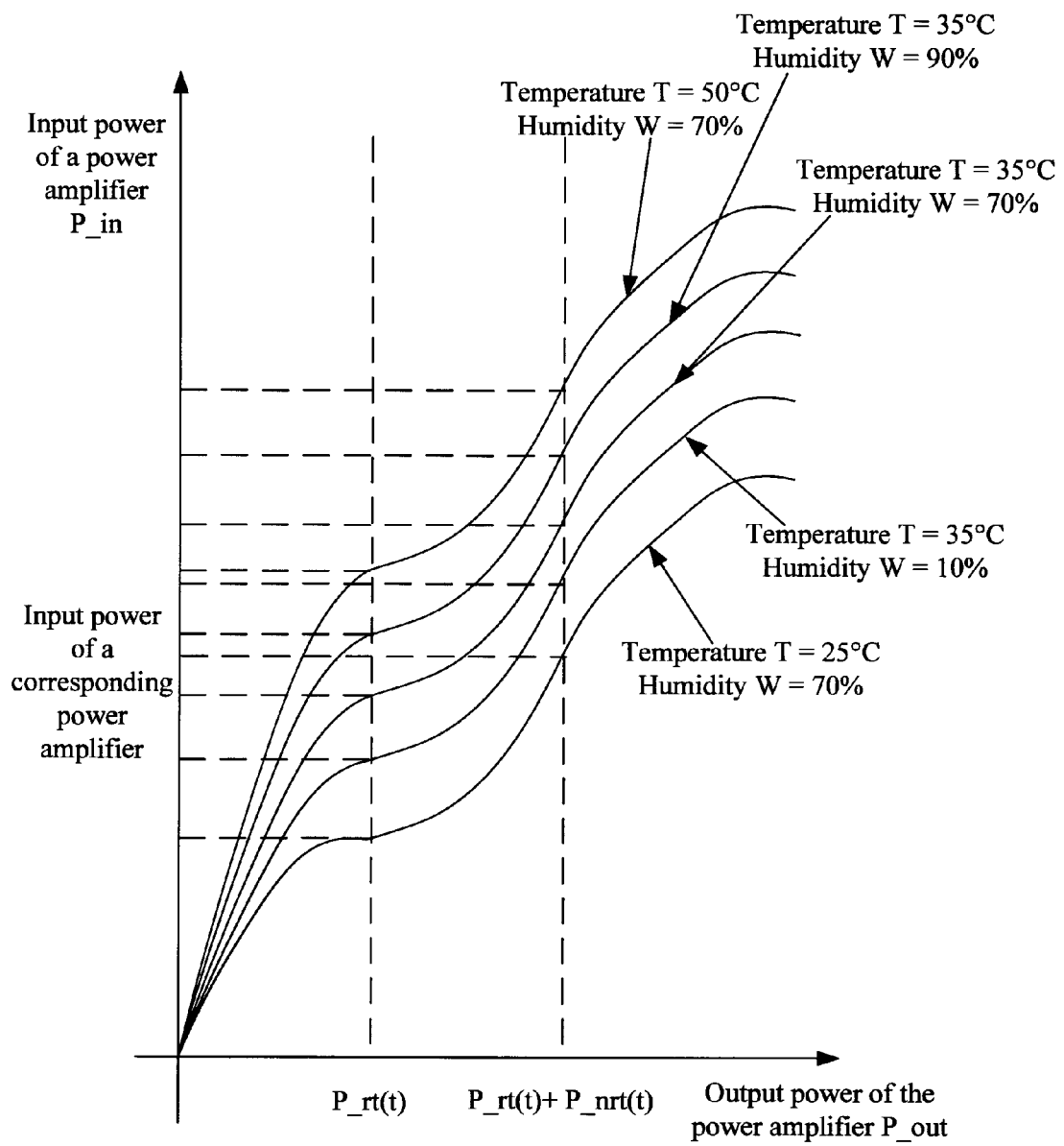
FIG. 2 is a reference diagram of a relationship between input and output of a power amplifier.

A power amplifier feature curve is obtained and a relationship between input and output of the power amplifier is established. For the power amplifier, ambient temperature and ambient humidity both affect the relationship between input and output of the power amplifier. Under a specific temperature, the relationship between input and output of the power amplifier is definite. FIG. 2 is a reference diagram of a relationship between input and output of the power amplifier.

The relationship between input and output of the power amplifier is as follows:

$$p\_in(t) = f(p\_out(t), T, W, G, BW),$$

where p_in(t) is input power of the power amplifier, p_out(t) is output power of the power amplifier, T is monitored temperature, W is monitored humidity, G is a state of the power amplifier (for example, normal or faulty), and BW is a transmit bandwidth of the power amplifier. Detected data and traffic of a real-time service may be substituted into the foregoing formula to determine required transmit power p_out_rt(t).

An impact of a certain parameter may be selectively ignored according to an actual requirement by considering it as a constant value or zero.

S202: Obtain service requirement information, where the service requirement information includes requirement information of a real-time service and requirement information of a non-real-time service. In this embodiment, service requirements such as a service type, a delay requirement, and a data length may be obtained; and services may be categorized into a real-time service and a non-real-time service, and required traffic of the real-time service and non-real-time service may be obtained.

In this embodiment, a sequence of obtaining each kind of the foregoing information may be adjusted, and does not affect subsequent implementation.

S203: Perform joint scheduling on a radio resource according to the obtained power amplifier feature, a real-time environment of the power amplifier, and a service requirement to obtain a required state of the power amplifier and a required parameter adjustment result. Parameters include a regulation parameter and a scheduling parameter.

A scheduling principle is that input power of the power amplifier is minimized. In this embodiment, the non-real-time service is allocated, a distribution is generated randomly, and the total input power of each non-real-time service distribution is calculated. A random distribution of the non-real-time service is repeated multiple times to select a non-real-time service distribution that has the minimum total input power to perform actual non-real-time service allocation. Meanwhile, a throughput rate of the non-real-time service needs to be ensured to meet a service requirement. That is, the total input power is minimized, and meanwhile, it is ensured that all bits of the non-real-time service can be transmitted.

According to the following mathematical expression of an optimization problem, a non-real-time service allocation situation is determined (in this embodiment, B bits of the non-real-time service are transmitted by using N timeslots):

$$\min\sum_{t=1}^{N} f^{-1}((p\_out\_rt(t) + p\_out\_nrt(t)), T, W, G, BW)$$

$$\text{subject to} \sum_{t=1}^{N} \log(1 + p\_out\_nrt(t)g(t)) = B,$$

where p_out_nrt(t) is transmit power of the non-real-time service and is an optimized parameter, g(t) is a channel gain, and B is the total traffic of the non-real-time service. Output power and a real-time work point of the power amplifier are determined according to allocation situations of the real-time service and non-real-time service.

S204: Output a scheduling result to the power amplifier to implement regulation on a power amplifier unit.

The power amplifier amplifies transmit power according to the scheduling result, which includes a regulation parameter and a scheduling parameter. Amplified transmit power first satisfies a requirement of the traffic of the real-time service. In the case that the requirement of the traffic of the real-time service can be satisfied, the non-real-time service is scheduled according to the scheduling parameter. In different time periods, different non-real-time services are scheduled, so that the power amplifier works in a region with high efficiency. Under the guide of this solution, work efficiency of the power amplifier is highest in combination with an actual situation. Definitely, the highest efficiency herein refers to a best effect achieved under a permission condition rather than a theoretically highest value, and it means improving the efficiency as much as possible.

An optimization policy in this embodiment is that the power amplifier feature curve is determined according to a real-time state of the power amplifier and then an allocation situation of the non-real-time service is adjusted according to the power amplifier feature curve, so that input power finally consumed by the power amplifier is minimized.

Further, as a new embodiment, performing joint scheduling on a radio resource according to the obtained power amplifier feature, a real-time environment of the power amplifier, and a service requirement to obtain a required state of the power amplifier and a required parameter adjustment result may also adopt the following method:

First, a power amplifier feature curve is obtained and a relationship between input and output of the power amplifier is established. Required transmit power p_out_rt(t) and a bandwidth BW1 are determined according to a real-time service. A scheduling principle is that a power consumption value of the power amplifier is minimized. In this embodiment, a non-real-time service is allocated, a distribution is generated randomly, and a total power consumption value of the power amplifier of each non-real-time service distribution is calculated. A random distribution of the non-real-time service is repeated multiple times to select a non-real-time service distribution that has the minimum power consumption value of the power amplifier to perform actual non-real-time service allocation. Meanwhile, a throughput rate of the non-real-time service needs to be ensured to meet a service requirement. That is, the total input power is minimized, and meanwhile, it is ensured that all bits of the non-real-time service can be transmitted.

According to the following optimization problem, a non-real-time service allocation situation is determined (in this embodiment, B bits of the non-real-time service are transmitted by using N timeslots):

$$\min\sum_{t=1}^{N} f^{-1}((p\_out\_rt(t)+p\_out\_nrt(t)), T, W, G, BW1+BW2)$$

$$\text{subject to} \sum_{t=1}^{N} BW2 \log(1+p\_out\_nrt(t)g(t)) = B,$$

where p_out_nrt(t) and BW2 are transmit power and an occupied bandwidth of the non-real-time service and are both optimized parameters, g(t) is a channel gain, and B is the total traffic of the non-real-time service.

Output power and a real-time work point of the power amplifier are determined according to allocation situations of the real-time service and non-real-time service.

An optimization policy in this embodiment is that part of real-time states (factors except a bandwidth are mainly considered because factors such as temperature and humidity may be directly determined but the bandwidth needs to be adjusted with power) of the power amplifier are determined first, and then configuration (bandwidth and required transmit power) of the power amplifier is comprehensively adjusted according to the non-real-time service, so that input power finally consumed by the power amplifier is minimized. In this embodiment, the bandwidth, as a factor that affects the power amplifier feature curve, may also be adjusted at the same time. Through a process of jointly adjusting a power amplifier feature and output power of the power amplifier, the power consumption value of the power amplifier is minimized.

Further, as a new embodiment, performing joint scheduling on a radio resource according to the obtained power amplifier feature, a real-time environment of the power amplifier, and a service requirement to obtain a required state of the power amplifier and a required parameter adjustment result may also adopt the following method:

A power amplifier feature curve is obtained, and a relationship between input and output of the power amplifier is established. Required transmit power p_out_rt(t) is determined according to a real-time service.

A scheduling principle is that heat output externally by the power amplifier is minimized. In this embodiment, the non-real-time service is allocated, a distribution is generated randomly, and the heat of each non-real-time service distribution is calculated. A random distribution of the non-real-time service is repeated multiple times to select a non-real-time service distribution that has the minimum total heat to perform actual non-real-time service allocation. Meanwhile, a throughput rate of the non-real-time service needs to be ensured to meet a service requirement. That is, the total input power is minimized, and meanwhile, it is ensured that all bits of the non-real-time service can be transmitted.

According to the following mathematical expression of an optimization problem, a non-real-time service allocation situation is determined (in this embodiment, B bits of the non-real-time service are transmitted by using N timeslots):

$$\min\sum_{t=1}^{N} [f^{-1}((p\_out\_rt(t)+p\_out\_nrt(t)), T, W, G, BW) - p\_out\_rt(t) - p\_out\_nrt(t)]$$

$$\text{subject to} \sum_{t=1}^{N} \log(1+p\_out\_nrt(t)g(t)) = B,$$

where p_out_nrt(t) is transmit power of the non-real-time service, g(t) is a channel gain, and B is the total traffic of the non-real-time service.

Output power and a real-time work point of the power amplifier are determined according to allocation situations of the real-time service and non-real-time service.

An optimization policy in this embodiment is that the power amplifier feature curve is determined according to a real-time state of the power amplifier and then an allocation situation of the non-real-time service is adjusted according to the power amplifier feature curve, so that heat output externally by the power amplifier is minimized. Output heat is obtained by subtracting output power from input power.

Further, as a new embodiment, performing joint scheduling on a radio resource according to the obtained power amplifier feature, a real-time environment of the power amplifier, and a service requirement to obtain a required state of the power amplifier and a required parameter adjustment result may also adopt the following method:

A power amplifier feature curve is obtained, and a relationship between input and output of the power amplifier is established. Required transmit power p_out_rt(t) is determined according to a real-time service. A scheduling principle is that a peak-to-average ratio of the power amplifier is minimized. In this embodiment, the non-real-time service is allocated, a distribution is generated randomly, and a peak-to-average ratio of the power amplifier of each non-real-time service distribution is calculated. A random distribution of the non-real-time service is repeated multiple times to select a non-real-time service distribution that has the minimum peak-to-average ratio of the power amplifier to perform actual non-real-time service allocation. Meanwhile, a throughput rate of the non-real-time service needs to be ensured to meet a service requirement. That is, the total input power is minimized, and meanwhile, it is ensured that all bits of the non-real-time service can be transmitted.

According to the following optimization problem, a non-real-time service allocation situation is determined (in this embodiment, B bits of the non-real-time service are transmitted by using N timeslots): min p_in_max/p_in_avg, where a peak-to-average ratio of the power amplifier is p_in_max/p_in_avg.

Average PA input power during the whole period is:

$$p\_in\_avg = \sum_{t=1}^{N} [f^{-1}((p\_out\_rt(t) + p\_out\_nrt(t)), T, W, G, BW)]/N$$

The maximum transmit power during the whole period is:

$$p\_in\_max = \max\{f^{-1}((p\_out\_rt(t) + p\_out\_nrt(t)), T, W, G, BW)\}$$

$$\text{subject to} \sum_{t=1}^{N} \log(1 + p\_out\_nrt(t)g(t)) = B,$$

where p_out_nrt(t) is transmit power of the non-real-time service, g(t) is a channel gain, and B is the total traffic of the non-real-time service. Output power and a real-time work point of the power amplifier are determined according to allocation situations of the real-time service and non-real-time service.

An optimization policy in this embodiment is that the power amplifier feature curve is determined according to a real-time state of the power amplifier and then an allocation situation of the non-real-time service is adjusted according to the power amplifier feature curve, so that the peak-to-average ratio of the power amplifier is minimized.

Further, as a new embodiment, performing joint scheduling on a radio resource according to the obtained power amplifier feature, a real-time environment of the power amplifier, and a service requirement to obtain a required state of the power amplifier and a required parameter adjustment result may also adopt the following method:

A power amplifier feature curve is obtained, and a relationship between input and output of the power amplifier is established. Required transmit power p_out_rt(t) is determined according to a real-time service.

Output power p_out_min corresponding to a low-efficiency critical point is determined according to the power amplifier feature curve; and output power p_out_max corresponding to a high-efficiency critical point is determined according to the power amplifier feature curve.

Required transmit power p_out_rt(t) is determined according to a real-time service, and required transmit power p_nrt is determined according to a current non-real-time service.

If p_out_rt(t)+p_nrt>p_out_max, part of non-real-time services are placed in a cache device until actual transmit power p_out_nrt(t) of the non-real-time service satisfies p_out_rt(t)+p_out_nrt(t)≦p_out_max; and if p_out_rt(t)+p_nrt<p_out_min, the non-real-time service is read from the cache device until the actual transmit power p_out_nrt(t) of the non-real-time service satisfies p_out_rt(t)+p_out_nrt(t)≧p_out_min.

Output power and a real-time work point of the power amplifier are determined according to allocation situations of the real-time service and non-real-time service. An optimization policy in this embodiment is that the power amplifier feature curve is determined according to a real-time state of the power amplifier, and then two thresholds (a high-efficiency critical point and a low-efficiency critical point) of the transmit power are determined according to the power amplifier feature curve. The actual output power of the non-real-time service is adjusted according to the two thresholds. When the actual output power is higher than the high-efficiency critical point, part of the non-real-time services are stored into the cache; when the actual output power is lower than the low-efficiency critical point, part of the non-real-time services are read from the cache.

Further, as a new embodiment, performing joint scheduling on a radio resource according to the obtained power amplifier feature, a real-time environment of the power amplifier, and a service requirement to obtain a required state of the power amplifier and a required parameter adjustment result may also adopt the following method:

A power amplifier feature curve is obtained, and a relationship between input and output of the power amplifier is established. Required transmit power p_out_rt(t) is determined according to a real-time service.

Transmit power p_out_min corresponding to a low-efficiency critical point is determined according to the power amplifier feature curve. The required transmit power p_out_rt(t) is determined according to the real-time service, and required transmit power p_nrt is determined according to a current non-real-time service.

If p_out_rt(t)+p_nrt<p_out_min, a non-real-time service is read from a cache device until actual transmit power p_out_nrt(t) of the non-real-time service satisfies p_out_rt(t)+p_out_nrt(t)≧p_out_min.

Output power and a real-time work point of the power amplifier are determined according to allocation situations of the real-time service and non-real-time service. An optimization policy in this embodiment is that the power amplifier feature curve is determined according to a real-time state of the power amplifier, and then a low-efficiency critical value (point) of the transmit power is determined according to the power amplifier feature curve. The actual output power of the non-real-time service is adjusted according to this threshold. When the transmit power is lower than the threshold, part of non-real-time services are read from the cache.

Further, as a new embodiment, performing joint scheduling on a radio resource according to the obtained power amplifier feature, a real-time environment of the power amplifier, and a service requirement to obtain a required state of the power amplifier and a required parameter adjustment result may also adopt the following method:

A power amplifier feature curve is obtained, and a relationship between input and output of the power amplifier is established. Required transmit power p_out_rt(t) is determined according to a real-time service.

Output power p_out_max corresponding to a high-efficiency critical point is determined according to the power amplifier feature curve. The required transmit power p_out_rt(t) is determined according to the real-time service, and required transmit power p_nrt is determined according to a current non-real-time service.

If p_out_rt(t)+p_nrt>p_out_max, part of non-real-time services are placed in a cache device until actual transmit power p_out_nrt(t) of the non-real-time service satisfies p_out_rt(t)+p_out_nrt(t)≦p_out_max.

Output power and a real-time work point of the power amplifier are determined according to allocation situations of the real-time service and non-real-time service. An optimization policy in this embodiment is that the power amplifier feature curve is determined according to a real-time state of the power amplifier, and then a high-efficiency critical value (point) of the transmit power is determined according to the power amplifier feature curve. The actual output power of the non-real-time service is adjusted according to this threshold. When the output power is higher than the threshold, part of the non-real-time services are stored into the cache.

Further, optimization objects in the embodiments may be combined according to different weights to balance each index.

In the foregoing embodiments, the scheduling parameter is directed, in the case that a power requirement of the real-time service is satisfied, to allocating output power requirements of the power amplifier of the non-real-time service to different time periods according to the power amplifier feature information, so that the power amplifier works in an amplified region with the highest efficiency.

In some embodiments of the present invention, the power amplifier feature information is obtained, and services are categorized into a real-time service and a non-real-time service. During scheduling, the non-real-time service is properly scheduled according to an analysis of the power amplifier feature and a situation of the real-time service. In this way, most of services are in a region where the power amplifier works with higher efficiency, thereby improving a utilization rate of the power amplifier.

The embodiments of the present invention may be implemented on a power scheduling apparatus of a power amplifier of a base station. For example, In a GSM/UMTS system, the power scheduling apparatus is deployed on a base station controller, while in an LTE system, the power scheduling apparatus is deployed on an eNB. An embodiment of the present invention provides a power scheduling apparatus of a power amplifier of a base station. With collaboration of the power scheduling apparatus and the power amplifier, the foregoing method embodiments may be implemented.

Figure 3:
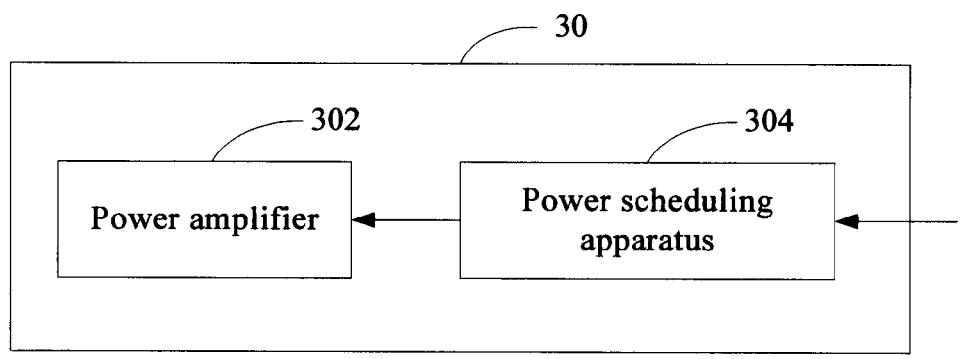
FIG. 3 is a schematic structural diagram of a base station according to an embodiment of the present invention.

Referring to FIG. 3, a base station 30 in an embodiment of the present invention includes a power amplifier 302 and a power scheduling apparatus 304. The power amplifier 302 amplifies transmit power. The power scheduling apparatus 304 is configured to obtain power amplifier feature information and service requirement information of the power amplifier, where the service requirement information includes requirement information of a real-time service and requirement information of a non-real-time service; and determine a regulation parameter and a scheduling parameter of the power amplifier according to the service requirement information and the power amplifier feature information. The power amplifier 302 performs transmit power regulation according to the regulation parameter to obtain amplified transmit power, where the amplified transmit power satisfies a requirement of traffic of the real-time service; and the power amplifier schedules a service in the non-real-time service according to the scheduling parameter and allocates output power requirements of the non-real-time service to different time periods.

For the power amplifier 302, the amplified transmit power first satisfies the requirement of the traffic of the real-time service. In the case that the requirement of the traffic of the real-time service can be satisfied, the non-real-time service is scheduled according to the scheduling parameter. In different time periods, different non-real-time services are scheduled, so that the power amplifier works in a region with high efficiency. Under the guide of this solution, work efficiency of the power amplifier is highest in combination with an actual situation. The highest efficiency herein refers to a best effect achieved under a permission condition rather than a theoretically highest value, and it means improving the efficiency as much as possible.

Figure 4:
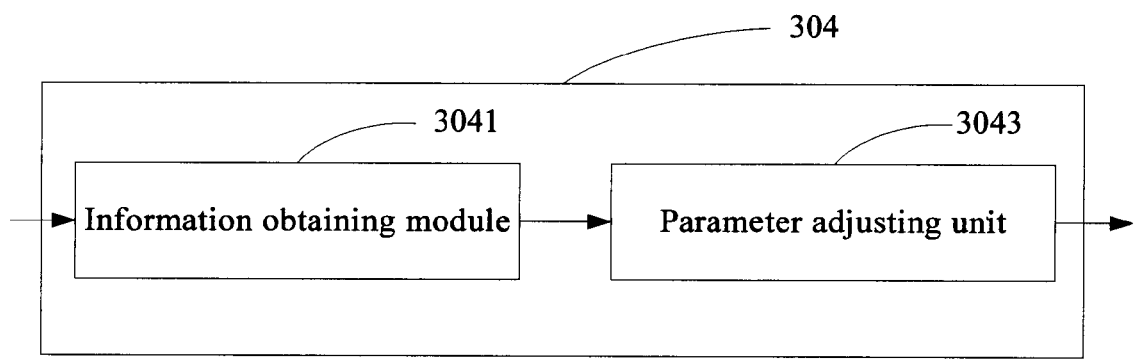
FIG. 4 is a schematic structural diagram of a base station power scheduling apparatus according to an embodiment of the present invention.

Referring to FIG. 4, a power scheduling apparatus 304 of a power amplifier of a base station includes:

An information obtaining module 3041 is configured to obtain power amplifier feature information and service requirement information, where the service requirement information includes requirement information of a real-time service and requirement information of a non-real-time service.

Further, the power amplifier feature information obtained by the information obtaining module 3041 indicates work efficiency of the power amplifier in a working state. The information obtaining module 3041 determines a corresponding relationship between input power and output power of the power amplifier according to an environmental parameter to obtain the power amplifier feature information, where the environmental parameter includes ambient temperature or ambient humidity; alternatively, the information obtaining module 3041 determines a corresponding relationship between input power and output power of the power amplifier according to a service parameter to obtain the power amplifier feature information, where the service parameter includes a state of the power amplifier or a transmit bandwidth.

A parameter adjusting unit 3043 is configured to determine a regulation parameter and a scheduling parameter of the power amplifier according to the service requirement information and the power amplifier feature information.

The information obtaining module 3041 determines a corresponding relationship between input power and output power of the power amplifier according to an environmental parameter to obtain the power amplifier feature information, where the corresponding relationship indicates work efficiency of the power amplifier in a working state, and the parameter includes ambient temperature or ambient humidity or a state of the power amplifier or a transmit bandwidth.

Further, the parameter adjusting unit 3043 is further configured to determine a low efficiency critical value according to the power amplifier feature information; and further determine a scheduled non-real-time service in the non-real-time service, so that a sum of required values of output power of the real-time service and output power of the scheduled non-real-time service is not smaller than the low efficiency critical value of the power amplifier.

Further, the parameter adjusting unit 3043 is further configured to determine a high efficiency critical value according to the power amplifier feature information; and further determine a scheduled non-real-time service in the non-real-time service, so that a sum of required values of output power of the real-time service and output power of the scheduled non-real-time service is not greater than the high efficiency critical value of the power amplifier.

The determining by the parameter adjusting unit 3043 the scheduling parameter of the power amplifier according to the service requirement information and the power amplifier feature information includes: determining the scheduling parameter, so that a sum of input power of the power amplifier is minimized, or power consumption of the power amplifier is minimized, or a peak-to-average ratio of the power amplifier is minimized; and determining the regulation parameter of the power amplifier according to the service requirement information and the power amplifier feature information, so that the power amplifier at least satisfies a requirement of traffic of the real-time service according to the amplified transmit power. In conclusion, the regulation parameter and scheduling parameter that are determined by the parameter adjusting unit 3043 enable the power amplifier to work in an amplified region with the highest efficiency.

In the embodiments of the present invention, the power scheduling apparatus of the power amplifier of the base station obtains the power amplifier feature information, and categorizes services into a real-time service and a non-real-time service. During scheduling, the non-real-time service is properly scheduled according to an analysis of the power amplifier feature and a situation of the real-time service. In this way, most of services are in a region where the power amplifier works with higher efficiency, thereby improving a utilization rate of the power amplifier.

Meanwhile, an embodiment of the present invention further discloses a base station in a communication system, where the base station may be applied to a GSM/UMTS or an LTE system. The base station may be a communication base station that may perform the methods disclosed in the method embodiments, is configured to control a power amplifier by using the methods in the method embodiments, and includes the power scheduling apparatus of the power amplifier of the base station in the foregoing apparatus embodiments.

In this embodiment of the present invention, the base station obtains power amplifier feature information, and categorizes services into a real-time service and a non-real-time service. During scheduling, the non-real-time service is properly scheduled according to an analysis of the power amplifier feature and a situation of the real-time service. In this way, most of services are in a region where the power amplifier works with higher efficiency, thereby improving a utilization rate of the power amplifier.

Persons of ordinary skill in the art may understand that all or part of steps in the foregoing method embodiments may be implemented by a program instructing relevant hardware. The foregoing program may be stored in a computer readable storage medium. When the program is executed, the steps in the foregoing method embodiments are executed. The foregoing storage medium may be any medium that can store program codes, such as a ROM, a RAM, a magnetic disk, or an optical disk.

What is claimed is:

1. A method of operating a power amplifier, the method comprising:
   obtaining power amplifier feature information and service requirement information, wherein the service requirement information comprises requirement information of a real-time service and requirement information of a non-real-time service;
   selecting a regulation parameter and a scheduling parameter of the power amplifier according to the service requirement information and the power amplifier feature information; and
   setting power amplifier transmit power in accordance with the selected regulation parameter to obtain amplified transmit power, wherein the amplified transmit power satisfies a requirement of traffic of the real-time service; and
   scheduling, by the power amplifier, a service for the non-real-time service in accordance with the selected scheduling parameter, and allocating power amplifier output power requirements of the non-real-time service to a plurality of different time periods.

2. The method according to claim 1, wherein the power amplifier feature information indicates power amplifier work efficiency in a working state, and obtaining power amplifier feature information comprises determining a relationship between input power and output power of the power amplifier according to an environmental parameter, wherein the environmental parameter comprises ambient temperature or ambient humidity.

3. The method according to claim 1, wherein the power amplifier feature information indicates power amplifier work efficiency in a working state, and obtaining power amplifier feature information comprises determining a relationship between input power and output power of the power amplifier according to a service parameter, wherein the service parameter comprises a state of the power amplifier or a transmit bandwidth.

4. The method according to claim 1, further comprising:
   determining a low efficiency critical value of the power amplifier according to the power amplifier feature information; and
   wherein selecting the power amplifier scheduling parameter comprises determining a scheduled non-real-time service for the non-real-time service, to establish a sum of required values of output power of the real-time service and output power of the scheduled non-real-time service that is not less than the low efficiency critical value of the power amplifier.

5. The method according to claim 1, further comprising:
   determining a high efficiency critical value according to the power amplifier feature information; and
   wherein selecting the power amplifier scheduling parameter comprises:
   selecting a scheduled non-real-time service so that a sum of required values of output power of the real-time service and output power of the scheduled non-real-time service is not greater than the high efficiency critical value.

6. The method according to claim 1, wherein selecting the regulation parameter and the scheduling parameter of the power amplifier comprises:
   selecting scheduling parameters to minimize a sum of the input power of the power amplifier, or minimize power consumption of the power amplifier, or minimize a peak-to-average ratio of the power amplifier; and
   determining the regulation parameter of the power amplifier according to the service requirement information and the power amplifier feature information, so that the power amplifier at least satisfies the requirement of the traffic of the real-time service according to the amplified transmit power.

7. The method according to claim 6, wherein selecting the regulation parameter and the scheduling parameter of the power amplifier comprises
   generating a plurality of distributions for the non-real-time service;
   calculating a sum of input power of the power amplifier for each distribution of non-real-time service; and
   selecting a distribution situation in which the sum of the input power of the power amplifier is minimized.

8. The method according to claim 1, wherein the regulation parameter and the scheduling parameter of the power amplifier are selected according to the service requirement information and the power amplifier feature information to optimize power amplifier transform efficiency.

9. A base station, comprising:
   a power amplifier and a power scheduling apparatus, wherein:
   the power scheduling apparatus is configured to obtain power amplifier feature information and service requirement information, and select a power amplifier regulation parameter and a power amplifier scheduling parameter according to the service requirement information and the power amplifier feature information, wherein the service requirement information comprises requirement information of a real-time service and requirement information of a non-real-time service; and
   the power amplifier performs transmit power regulation according to the selected regulation parameter to obtain amplified transmit power, wherein the amplified transmit power is selected to satisfy a traffic requirement of the real-time service, and the power amplifier being operated to schedule a service for in the non-real-time service according to the scheduling parameter and to allocate output power requirements of the non-real-time service to a plurality of different time periods.

10. The base station according to claim 9, wherein the power scheduling apparatus comprises:
    an information obtaining module configured to obtain the power amplifier feature information and the service requirement information, wherein the service requirement information comprises the requirement information of the real-time service and the requirement information of the non-real-time service; and a parameter adjusting unit, configured to select the regulation parameter and the scheduling parameter of the power amplifier according to the power amplifier feature information and the service requirement information.

11. The base station according to claim 10, wherein the power amplifier feature information obtained by the information obtaining module indicates work efficiency of the power amplifier in a working state, and the information obtaining module is configured to determine a relationship between input power and output power of the power amplifier according to an environmental parameter, wherein the environmental parameter comprises ambient temperature or ambient humidity.

12. The base station according to claim 10, wherein the power amplifier feature information obtained by the information obtaining module indicates work efficiency of the power amplifier in a working state, and the information obtaining module is configured to determine a relationship between input power and output power of the power amplifier according to a service parameter to obtain the power amplifier feature information, wherein the service parameter comprises a state of the power amplifier or a transmit bandwidth.

13. The base station according to claim 10, wherein the parameter adjusting unit is further configured to determine a low efficiency critical value according to the power amplifier feature information, and to further determine a scheduled non-real-time service in the non-real-time service, such that a sum of required values of output power of the real-time service and output power of the scheduled non-real-time service is not less than the low efficiency critical value of the power amplifier.

14. The base station according to claim 10, wherein the parameter adjusting unit is further configured to determine a high efficiency critical value according to the power amplifier feature information, and to further determine a scheduled non-real-time service in the non-real-time service, so that a sum of required values of output power of the real-time service and output power of a scheduled non-real-time service is not greater than the high efficiency critical value.

15. The base station according to claim 10, wherein the selection by the parameter adjusting unit of the scheduling parameter of the power amplifier comprises:

selecting the scheduling parameter so that a sum of input power of the power amplifier is minimized, or power consumption of the power amplifier is minimized, or a peak-to-average ratio of the power amplifier is minimized; and selecting the regulation parameter of the power amplifier according to the service requirement information and the power amplifier feature information, so that the power amplifier satisfies the requirement of the traffic of the real-time service according to the amplified transmit power.

16. The base according to claim 9, wherein the selection by the parameter adjusting unit of the regulation parameter and the scheduling parameter of the power amplifier comprises:

generating a plurality of distributions for the non-real-time service;

calculating for each distribution a sum of input power of the power amplifier, or power consumption of the power amplifier, or a peak-to-average ratio of the power; and selecting a distribution situation in which the sum of the input power of the power amplifier, or the power consumption of the power amplifier, or the peak-to-average ratio of the power amplifier is minimized.

17. The method according to claim 6, wherein the determining the regulation parameter and the scheduling parameter of the power amplifier comprises:

generating a plurality of distributions for the non-real-time service;

calculating power consumption of the power amplifier for each distribution of non-real-time service; and selecting a distribution situation in which the power consumption of the power amplifier is minimized.

18. The method according to claim 17, wherein at least one of the plurality of non-real-time service distributions is generated randomly.

19. The method according to claim 6, wherein the determining the regulation parameter and the scheduling parameter of the power amplifier comprises:

generating a plurality of distributions for the non-real-time service;

calculating a peak-to-average ratio of the power amplifier for each distribution of non-real-time service; and selecting a distribution situation in which the peak-to-average ratio of the power amplifier is minimized.

20. The method according to claim 19, wherein at least one of the plurality of non-real-time service distributions is generated randomly.

* * * * *